SEMICONDUCTOR CONTROLLED SWITCH CIRCUIT COMPONENT

Filed Sept. 24, 1965

P TYPE

N TYPE

INVENTOR.
DONOVAN F. PETERSON
BY [signature]
ATT'Y.

INVENTOR.
DONOVAN F. PETERSON
BY [signature]
ATT'Y.

United States Patent Office 3,448,298

Patented June 3, 1969

3,448,298

SEMICONDUCTOR CONTROLLED SWITCH CIRCUIT COMPONENT

Donovan F. Peterson, Elm Grove, Wis., assignor to U.S. Automatics Corporation, Pewaukee, Wis., a corporation of Delaware Filed Sept. 24, 1965, Ser. No. 489,985
Int. Cl. K03k *17/72;* H02b *9/00;* H01l *11/10*
U.S. Cl. 307—303 10 Claims

ABSTRACT OF THE DISCLOSURE

The specification discloses a semiconductor controlled switch highly sensitive to low power control signals for controlling both high and low currents. The switch circuit comprises a heavy current silicon rectifier and a heavy current silicon transistor connected in series with the power source and load. The silicon transistor is connected with a low power germanium transistor of high signal sensitivity which provides the relative large biasing signal required to switch it and the two transistors are coupled in a positive feedback configuration to assure optimum switching characteristics. The diode provides heavy current carrying capacity protection for the transistor, and a stable and accurate bias reference for control signal comparison purposes.

An integrated circuit embodiment as well as modifications and several applications are disclosed.

This present invention is in the field of semiconductor controlled switches for switching electrical current in a wide range of circuit applications which require high sensitivity to control signals of low power and a high switching speed that minimizes component heating.

As used herein, "current" is primarily concerned with electron flow as it relates to electrodynamic considerations including alternating current (A.C.) as well as direct current (D.C.) both constant and pulsating; "sensitivity" means the highest sensitivity desired to signals of low potential within the limits of design and materials; "speed" of switching is theoretically an instant time response qualified only by selected design, components and materials within the knowledge of the art; and, "heating" from a thermal effect viewpoint is related to speed of switching in that the faster a full switching response is accomplished the greater will be the efficiency with less heat generation in the semiconductor.

Fast response to control signals not only can be better accomplished with circuits and components of this invention, but greater economy is possible than that which has been possible with prior devices. Embodiments of the invention further provide improved and novel results and a versatility not possible with conventional controlled switches.

Heretofore, semiconductor switches having the ability to handle high currents lacked the sensitivity to control signals that would enable their use where the high sensitivity of a germanium junction is required and, semiconductors capable of the response characteristics of a sensitive germanium junction lack heavy current carrying capabilities.

An important object of the invention is to provide a simple, but comparatively inexpensive, semiconductor controlled switch which, either as an assembled portion of a circuit or as a unitized or integrated circuit component, will handle large currents with high sensitivity to small control signals.

The invention also contemplates a novel encapsulated semiconductor controlled component for switching power currents with high sensitivity to differences between a reference signal and electrical energy that is being conducted or stored under its control.

The invention is further characterized by a low signal sensitive, low power, high gain semiconductor arranged to render conductive a power conducting semiconductor interrelated therewith so as to induce mutual hyperconductivity with minimized signal strength and drain.

One of the objects of the invention is to provide a simplified semiconductor switch arrangement which handles heavy electrical power like a silicon semiconductor switch with the control sensitivity of a germanium device and do so equally well with large as well as minute variations in signal potentials that may be involved.

The invention is also characterized as a rectifying device having a very low resistance in a forward direction and a very high resistance in a reverse direction which can be switched from a nonconductive state to a hyperconductive state with the signal sensitivity of a low power germanium transistor.

The invention is further characterized by a germanium-silicon semiconductor control arrangement of at least four and preferably five junctions in which a germanium junction subjected only to signal potentials precesses in conduction two serially connected power conducting junctions, as fired by a signal of low potential, to develop a positive feed back or current multiplcation factor than can drive all three junctions to hyperconductivity with constancy and accuracy of performance.

Another object of the invention is to provide an improved current flow control switching device which is circuit connected in sentinel service as a voltage stand-off in a reverse direction and automatically and continuously senses the voltage status of a device controlled thereby antecedent to conducting electrical power thereto as required.

A further object resides in a circuit component which internally switches heavy currents with great sensitivity to a command or demand signal yet can be additionally controlled by other signals in a circuit arrangement of which it is a part.

Another object of the invention is to provide a current flow control device which senses signals from a slave device with little effect or being affected by the internal impedance of the slave device or the resistances incurred with remoteness by the length of connector leads that may be required.

A further object is to provide a semiconductor arrangement having a series of alternating hyperconductivity and nonconductivity states governed by the character of the current controlled and by differences in voltage potentials between a portion of the current controlled and a reference signal.

The invention also contemplates a circuit component by which the generation of a repeatable proportional pulse sequence pattern is controlled in relation to a reference voltage and a variable signal voltage.

These being among the objects, characteristics and advantages of the invention other and further objects including excellent stability, wide versatility, ease of manufacture and simplicity of application will become apparent from the description herein taken with the drawings in which.

The explanation of the invention for purposes of simplicity and ready understanding is related essentially to transistor and diode configurations, it being noted, however, that important distinctions exist in the basic concept of handling the flow of electrons and voltage potentials.

Depending upon the direction of electron flow and the orientation desired for the signal responsive junction in an electrical circuit either an N type or P type semiconductor embodiment can be employed having a four layer semiconductor rectifier arrangement similar in some respects to a controlled rectifier but with all four layers accessible for outside connection by means of external leads and terminals, and along with this rectifier arrangement, a three layer low power high gain germanium semiconductor similar to a transistor of the opposite P or N type can be employed with its three layers accessible through three of said four external leads for a four terminal embodiment (FIG. 6) but preferably with its base accessible for separate external connection through a separate lead in the five terminal embodiment. (FIGS. 1–5).

Figure 1:
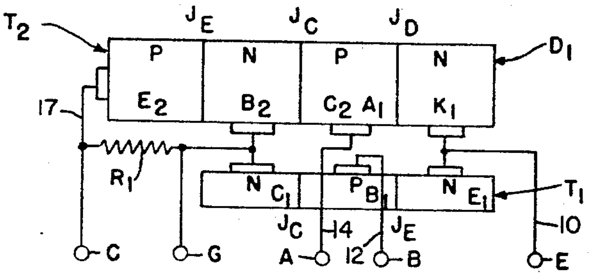
FIG. 1 is a block diagram of the arrangement of semiconductor layers and junctions of a semiconductor controlled switch embodying the invention for controlling the flow of current between a power source and a load.
Figure 3:
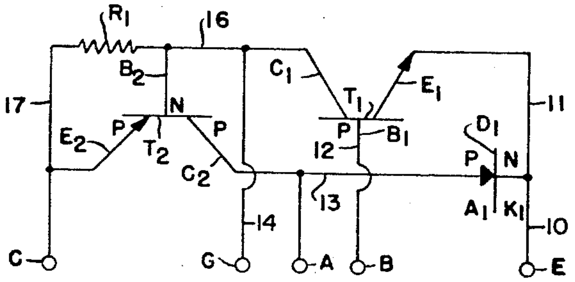
FIGS. 3 and 4 are circuit schematics of the embodiments diagrammed in FIGS. 1 and 2, respectively.

More particularly, the semiconductor controlled switch illustrated in FIGS. 1 and 3 may be considered to include essentially a diffused base heavy current silicon transistor T2 of the N type conductivity with a diode junction JD added at the collector end. The diode junction is polarized in the same direction as the emitter junction JE to provide a heavy current path when the switch is biased in a conductive state by a signal sensitive P type semiconductor T1 having the high sensitivity of a germanium transistor.

Figure 2:
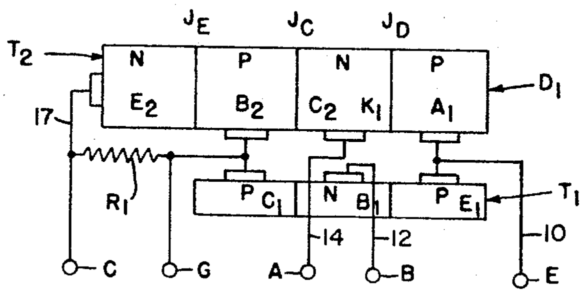
FIG. 2 is a block diagram similar to FIG. 1 showing the arrangement for a component having an N type conductivity.
Figure 7:
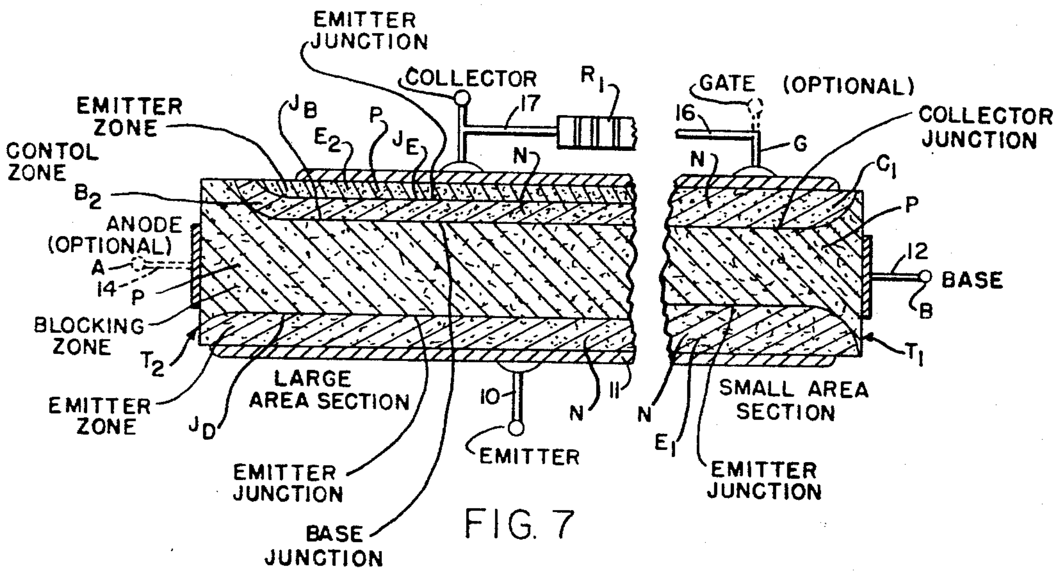
FIG. 7 is a diagram including a sectional showing of an integrated semiconductor embodying the invention which is representative of both P and N types with five terminals.

In a preferred embodiment, the two primary junctions JE and JC, in FIGS. 1, 2 and 7, comprise a wafer of base material B2 between them having a distribution of one impurity into which a higher concentration of another impurity is diffused to certain distances from opposite sides forming emitter E2 and collector C2. For instance, with respect to FIG. 1, the thin wafer B2 may be of silicon containing a small concentration of donor or N-type impurities such as arsenic. The wafer is subjected at high temperature to an atmosphere containing acceptor or P-type impurities such as boron which diffuse into the wafer from the outside, to provide emitter E2 and collector C2 and conventional transistor like junctions JE and JC. The third junction JD is a silicon diode junction obtained by doping or alloying a heavy concentration of P-type material, such as aluminum, as the A1 zone against an N-type impregnated silicon wafer K1. The two wafers are oriented as shown at junction JD in FIGS. 1 and 2 for N and P type conductivities.

Superimposed on the three N and P type elements which provide the two adjacent junctions JC and JD, is a germanium-type semiconductor transistor T1 of the highest base sensitivity desired which has the corresponding order of N and P type zones. The corresponding like-type zones of each pair are disposed in electrical contact or connection wth each other in a four terminal embodiment, but in the five terminal embodiment, the connections to C2 and B1 are brought out separately. The five terminal embodiment can be used as a four terminal device by connecting the C2 and B1 connections if desired.

In greater detail zones of the germanium transistor T1 are connected to corresponding polarity zones of the silicon transistor T2 for positive feedback or regenerative amplification purposes as shown best in FIGS. 1 and 2. Metal for establishing the electrically conductive paths is fused to the respective layers and either engages or is connected in conventional ways to provide the internal circuitry shown which includes a resistance material R1 inserted between conductive elements fused to the zones E2 and B2 of power transistor T2. The resistor R1 is a potential-equalizing resistance bridging the junction J3 to render the power transistor nonconducting when the firing signal at E1 terminates and renders the JC junction of T1 nonconducting. Whenever the potential at terminal G equals or exceeds that at terminal C, the junction J3 is rendered nonconductive and flow through junction JD ceases also.

Figure 4:
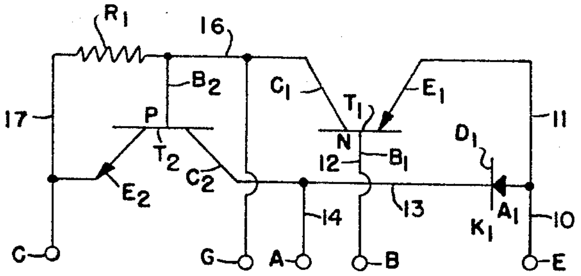

For further explanation, reference is made to FIGS. 3 and 4 where the components embodying the invention are diagrammatically represented in conventional circuitry designations with the terminals and associated external devices shown for a clearer understanding of the utility of the components. The design illustrated functions essentially as bistable semiconductor controlled semiconductor switch, as representative of various other possible uses and adaptions. Legends are also supplied to assist the explanation and it should be noted that the embodiments shown serve as bistable switches and no heat sinks are shown. Emitter, base and collector zones have been designated with letters E, B and C, respectively, and the conductivity type of each of the semiconductors has been indicated by appropriate characters, namely N and P types. Also, the five terminals of the component, as integrated, are lettered according to their identifiable function A (anode), B (base), C (collector), E (emitter), and G (gate).

More particularly with reference to FIG. 3 the circuit is one in which the rectifier D1 has its cathode K1 connected by lead 10 to the emitter or positive output terminal E of the component and by lead 11 to the emitter E1 of a highly sensitive NPN germanium transistor T1. The anode A1 of diode D1 is connected by lead 13 to the collector C2 of a PNP power transistor T2, and can be connected by lead 12 to the base B1 of the transistor T1 if desired for a four terminal component. The anode A1 is further connected by lead 14 to the terminal A, and base B1 of transistor T1 is connected preferably to separate terminal B. Reference voltage sources can be connected to terminals B or AB, or between both A and B. The collector C1 of transistor T1 is connected to the gate terminal G and also to the base B2 of the power transistor T2 by connection 16. Resistor R1 is connected to the terminal C and by connection 17 to the emitter E2 of transistor T2.

By way of demonstrating utility, assume that a reference voltage is connected to terminals A and B and the switch is connected in series with a power source and a load via output terminal C and output terminal E.

Referring to FIG. 3, if the voltage is zero between the terminals B and E, no current will flow through transistor T1 or diode D1. But when the potential at the terminal E is slightly negative with respect to B this differential establishes current flow along parallel paths that are from E to AB. Electrons will endeavor to flow through the transistor T1 and also the diode D1. However, the inherently higher forward voltage drop of the silicon diode requires a substantially greater potential differential before it will conduct than would be required for a germanium semiconductor. The germanium transistor T1 can conduct at a lower signal potential and will be the first to do so.

The T1 transistor conduction therefore precesses conductivity of the diode D1 and in doing so instigates electron flow from terminal E to base B2 of transistor T2 which lowers the potential at B2 below that upon emitter E2. The diode D1 might begin to conduct if the reference voltage at AB was sufficiently high. But whether this happens to be the case or not, the flow of electrons to base B2 lowering its potential drives the power transistor T2 to a conductive state. The resulting current further forward biases transistor T1 at its base B1 and drives it to its stable hyperconductive region and therewith amplifies the negative bias on the base B2 to drive the power transistor T2 to its stable hyperconductive region. Thereupon, the transistors T1 and T2, each being in series with the base of the other and both being hyperconductive, the entire semiconductor controlled switch becomes hyperconductive to deliver heavy current through the power transistor T2 and diode D1 junctions. The flow of electrons through base B2 being quite small, the transistor T1 carries very little current and therefore can be designed to be exceedingly sensitive.

This hyperconductive state remains and is self sustaining until the potential at terminal C ebbs below the potential at termial E, or, if terminals A and B are separated, until the initially acceptable firing signal ceases. In the case of the signal ceasing, the forward biases successively collapse upon bases B1 and B2 to render the component nonconductive. Also, any time that terminal G is pulsed positively, the transistor T2 is reverse biased to render it nonconductive. Furthermore, any time the connection between terminals A and B is merely opened or a reverse bias is applied to terminal B, the component is rendered nonconductive. Further nonconductivity occurs at the null points of a pulsating direct current or an alternating current. However, in this last contingency, hyperconduction is again established on the next pulse if the potential at terminal E is still below a predetermined potential at reference terminal B.

In this connection, it will be noted that the resistor R1 enables a quick effective drop in potential at the base B2 when transistor T1 conducts to fire transistor T2, and also equalizes the potential between base B2 and emitter E2 to restore nonconductivity when transistor T1 ceases conducting. For these purposes, the value of the resistor R1 is approximately 47 ohms.

It should be also noted that a suitable forward biasing signal applied directly to terminal B would render the component hyperconductive. This would be true also with a suitable signal applied to terminal G. In this latter case, the transistor T1 could remain nonconductive.

Figure 5:
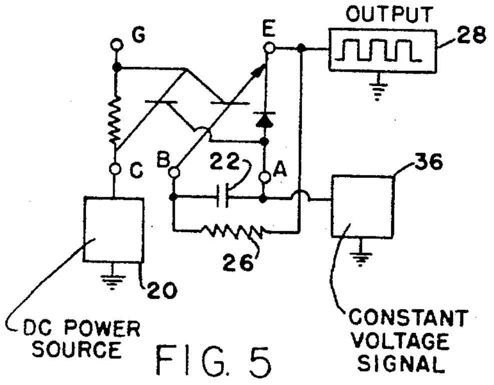
FIG. 5 is a circuit symbol indicating the embodiment shown in FIGS. 1 and 3 having five terminals for wide versatility.
Figure 6:
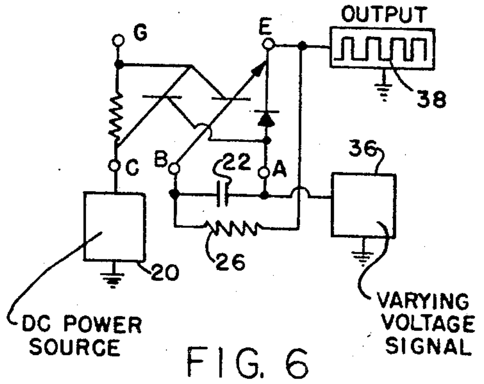
FIG. 6 is a circuit symbol of a modification having four terminals for specific circuit applications.

In FIGS. 5 and 6, components embodying the invention are symbolized in heavy lines as used in circuit presentation and are shown as connected to other circuit components to provide several different current modifying functions representative of their versatility.

When the component is used to switch continuous D.C. current introduced by a source 20 at terminal C (FIG. 5), a capacitor 22 is connected between terminals A and B, a bleed resistor 24 is connected between terminals B and E, and a control signal producing device 36 is connected to A. Such a device can provide a constant voltage signal and the charge and discharge of the capacitor will provide a uniform D.C. proportional switching to provide a curve pattern 28. If the device 36 connected to terminal A provides a varying signal having an increasing or decreasing voltage effect, the proportional switching will result in progressively changing the duration of the "on" portions of successive cycles progressively and changing the "off" portions of the successive cycles as represented by curve 38. An increasing potential would, for example, increase "on" and decrease "off" intervals.

Also for switching continuous applied D.C. current, a variable resistor can be connected between terminals G and A to provide a current with pulses varying in length in relation to the adjustment of the variable resistor or by a photoelectric cell in place of the variable resistor.

In the preferred embodiment of FIG. 7, a single wafer of germanium is impregnated with P type conductivity impurities with a fairly high resistivity. The type of conductivity is preserved in the mid-region of the wafer and serves as the blocking zone. A control zone is obtained on one side by differeing N type inpurities into the side of the wafer and fusing a metal plate thereon to receive a gate lead thereto and leaving a large area exposed. The impurity concentrations are very low at their internal boundary but increase greatly toward the outer face within the area of engagement by the metal plate.

The exposed larger area then has a very high gradient density of P type impurities diffused into it to provide an emitter zone that is capped with a metal connector fused thereto to provide a collector terminal.

The opposite side of the wafer has two anode zones also obtained by gradient diffusion of P type impurities therein. One of these zones is much smaller than the other and the diffusion here is to within .001 of the collector junction. This distance is much greater than with the other diffusion zone and thus different forward voltage potentials are provided between these two zones, the thinner one being the most sensitive. The two zones are electrically connected to a common emitter terminal.

Because of these unilateral diffusions, the final zone structure is nonsymmetrical. The thickness of the blocking zone in the center, the undisturbed diffused zones on the emitter side and one and two thin zones on the collector side provide a spatial and impurity concentration asymmetry which is deliberate for the operation of the bistable controlled rectifier. The large portion of the wafer comprises a high current carrying emitter and collector junctions controlled by signal current directed into the control zone which in turn has a control base junction backed up by another emitter junction control. This signal may come from the gate or from the collector junction. It will be observed that power current is thus conducted through the two forward biased emitter junctions and the control junction.

As mentioned, current can be provided to the control zone through the collector junction as when the blocking zone is supplied with signal through the base connector which is different in potential in the forward direction between the emitter and the base. The smaller, more sensitive emitter junction will become conductive, precessing the large emitter junction, and apply a feedback signal current to the control zone to render it conductive for the full flow of current, herein referred to as hyperconductive, between the collector and the emitter.

It will be observed that the gate connection as related to conventional silicon control rectifiers can be eliminated and a base connection that is missing is added as in a transistor. Also, it will be observed that a separate emitter terminal, as in a transistor, is eliminated. Furthermore, the wafer may be split before the process step of the diffusion of impurities and this separates the blocking zone for separate anode and base connections for circuit applications already described.

It will also be appreciated that with the split wafer, the larger portion can be of silicon and the smaller portion of germanium to provide like power current carrying capabilities of silicon controlled rectifiers.

The resistors R1 may be any suitable material and configuration desired.

Thus, the component described comprises a unitized semiconductor component which is sufficient in itself, or as controlled by an external source can impose any one of a number of current waveforms upon any type of electrical current that is convenionally used as a source of power.

Thus, the sensitivity for the switching function can be controlled in any one of a number of ways related to electron flow control and devices in which electron flow is an important adjunct to their operation, as well as in devices where voltage potentials are important concomitants.

Having thus described the invention and its various characteristics and including several specific embodiments, it will be understood that the embodiments are elementary in their form and are but illustrative of certain principles and parameters and that other and further arrangements may be provided by those skilled in the art which are within the spirit of the invention whose scope for which patent protection is sought is within the appended claims.

What is claimed is:

1. A semi-conductor controlled switch circuit for controlling electrical power in response to signals comprising:

two power terminals and a signal terminal, a first transistor having its emitter electrically connected to the first of said power terminals, a resistor electrically interconnected between the emitter and the base of the first transistor, means for electrically interconnecting the collector of the first transistor directly to the second of said power terminals including a diode polarized for conduction in the same direction as emitter-base junction of the first transistors, a second transistor having its collector electrically connected to said base of the first transistor, its emitter electrically connected to the second of said power terminals, and its base electrically connected to said signal terminal, the emitter-base junction of the second transistor being polarized for conduction in the same direction as the emitter-base junction of the first transistor, said signals being applied to the signal terminal whereby the current flowing through the switch circuit is controlled in response to signals applied to the signal terminal and the second power terminal.

2. The circuit defined in claim 1 comprising in addition means for electrically interconnecting the base of said second transistor to the collector of said first transistor by connecting an impedance between the signal terminal and a fourth terminal connected to the collector of the first transistor.

3. The circuit defined in claim 1 wherein said first transistor and said diode have silicon semi-conductor bodies and said signal responsive transistor has a germanium semi-conductor body.

4. The circuit of claim 3 wherein the first transistor and the diode are integrated into one piece of semi-conductor material.

5. The circuit of claim 4 wherein the second transistor is integrated with the piece of semi-conductor material.

6. A semi-conductor controlled switch comprising an integrated semi-conductor structure including two sections of semi-conductor material, each section having two major faces, the first section having four successive zones of opposite conductive type between its major faces in substantially parallel relation with its faces, the second section having three successive zones of opposite conductive type between its major faces in substantially parallel relation with its faces, means for interconnecting the two major faces having like polarity of the two sections, a low resistance connection to the other face of said first section, a resistor interconnecting the other major faces of said sections, and a second low resistance connection to the intermediate zone of the second section.

7. The semi-conductor controlled switch described in claim 6 in which the first section is of silicon and the second section is of germanium.

8. The semi-conductor controlled switch described in claim 6 including a low resistance connection to an intermediate zone of the first section having like polarity to said intermediate zone of the second section.

9. The semi-conductor controlled switch described in claim 6 including a low resistance connection to the other major face of said second section.

10. A semi-conductive device comprising two series of alternative zones of opposite types of semi-conductivity, one of four zones and the other of three zones, cross-paired in like types of semi-conductivity, independent electrical connections between each pair of the two pairs of the four zones of like conductivity, independent electrical connections to each zone of the intermediate pair of zones of like conductivity, a resistor interconnecting the terminal zones of opposite polarity, independent electrical connections to each of said terminal zones of opposite polarity, the junctions between the terminal zones of unlike conductivity and an intermediate zone in each series having different forward Zener characteristics in which said junction between the zones of said three zone series is the lesser of the two.

References Cited

UNITED STATES PATENTS

| | | | |
|---|---|---|---|
| 3,151,281 | 9/1964 | Kuehn | 317—130 |
| 3,238,388 | 3/1966 | Bensing | 307—255 |
| 3,315,090 | 4/1967 | Bruffey et al. | 307—255 |

JOHN W. HUCKERT, *Primary Examiner.*

R. F. SANDLER, *Assistant Examiner.*

U.S. Cl. X.R.

307—313; 317—235